United States Patent [19]
Watanabe

[11] Patent Number: 5,416,350
[45] Date of Patent: May 16, 1995

[54] SEMICONDUCTOR DEVICE WITH VERTICAL TRANSISTORS CONNECTED IN SERIES BETWEEN BIT LINES

[75] Inventor: Shigeyoshi Watanabe, Yokohama, Japan

[73] Assignee: Kabushiki Kaisha Toshiba, Kawasaki, Japan

[21] Appl. No.: 212,774

[22] Filed: Mar. 15, 1994

[30] Foreign Application Priority Data

Mar. 15, 1993 [JP] Japan .................................. 5-054218

[51] Int. Cl.⁶ .............................................. H01L 29/26
[52] U.S. Cl. ...................................... 257/330; 257/302; 257/401
[58] Field of Search ........................ 257/302, 329, 330

[56] References Cited

U.S. PATENT DOCUMENTS

| | | | |
|---|---|---|---|
| 4,630,088 | 12/1986 | Ogura et al. | 257/302 |
| 5,258,635 | 11/1993 | Nitayama et al. | 257/329 |
| 5,276,343 | 1/1994 | Kumagai et al. | 257/302 |

FOREIGN PATENT DOCUMENTS

| | | |
|---|---|---|
| 60-195974 | 10/1985 | Japan . |
| 2-188966 | 7/1990 | Japan . |

OTHER PUBLICATIONS

H. Takato, et al., "Impact of Surrounding Gate Transistor (SGT) for Ultra-High Density LSI's, IEE Transactions on Electron Devices", vol. 38, No. 3, Mar. 1991, pp. 573-578.

Primary Examiner—Robert P. Limanek
Attorney, Agent, or Firm—Foley & Lardner

[57] ABSTRACT

A semiconductor device connected between first and second wiring lines comprises a semiconductor substrate, a first semiconductor column formed by etching the substrate by a predetermined depth, a second semiconductor column formed by etching the substrate by a predetermined depth, with a predetermined distance set from the first semiconductor column, a first gate electrode formed around a side wall of the first semiconductor column with an insulating layer interposed, a second gate electrode formed around a side wall of the second semiconductor column with an insulating layer interposed, a first diffusion layer functioning as one of a source and a drain, the first diffusion layer being formed at a top portion of the first semiconductor column and connected to the first wiring line, a second diffusion layer functioning as another of the source and the drain, the second diffusion layer being formed at a top portion of the second semiconductor column and connected to the second wiring line, and a diffusion layer functioning as one of a source and a drain, the diffusion layer being formed at bottom portions and peripheral portions of the bottom portions of the first and second semiconductor columns and shared by the first and second semiconductor columns.

21 Claims, 10 Drawing Sheets

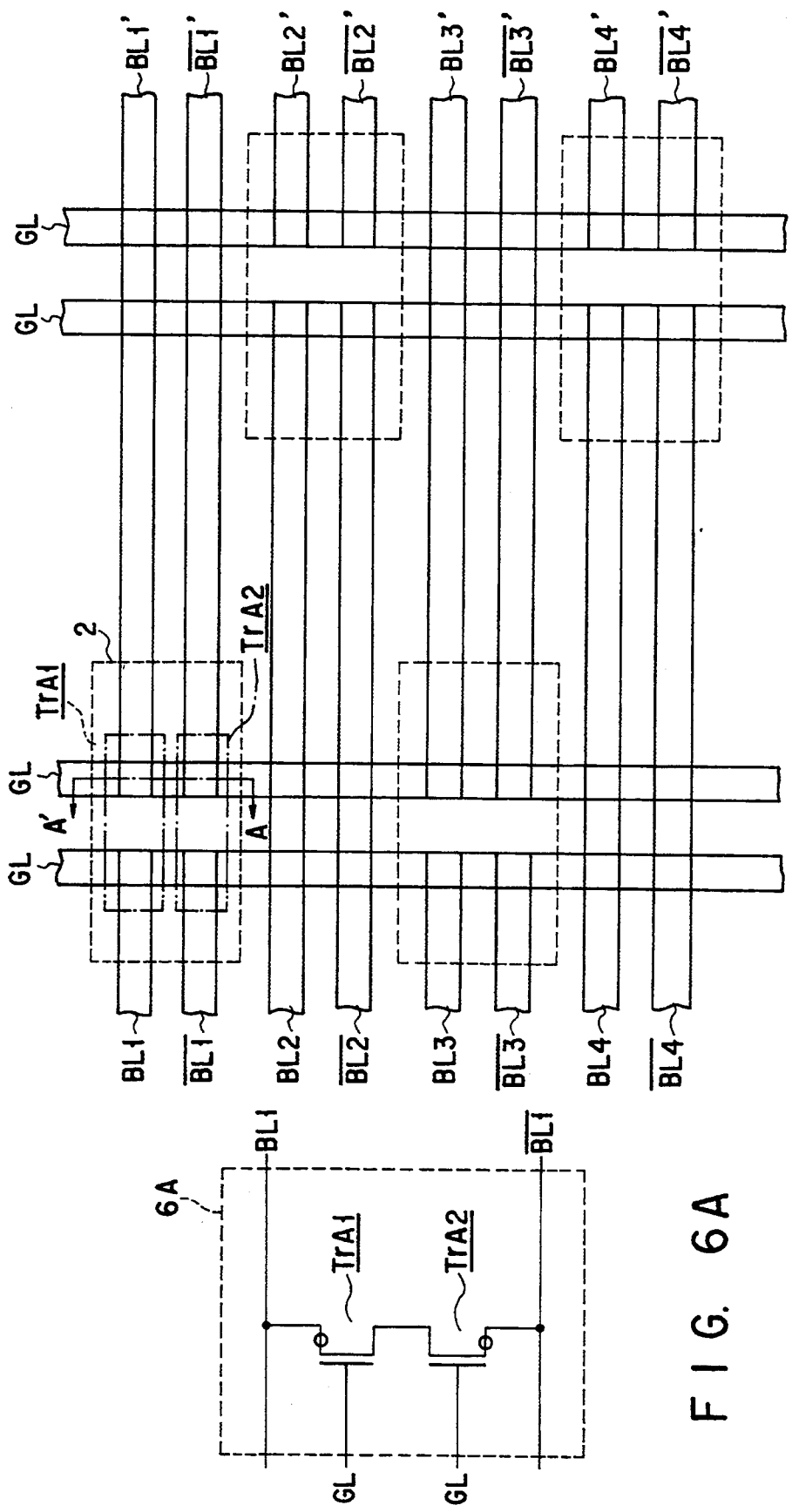

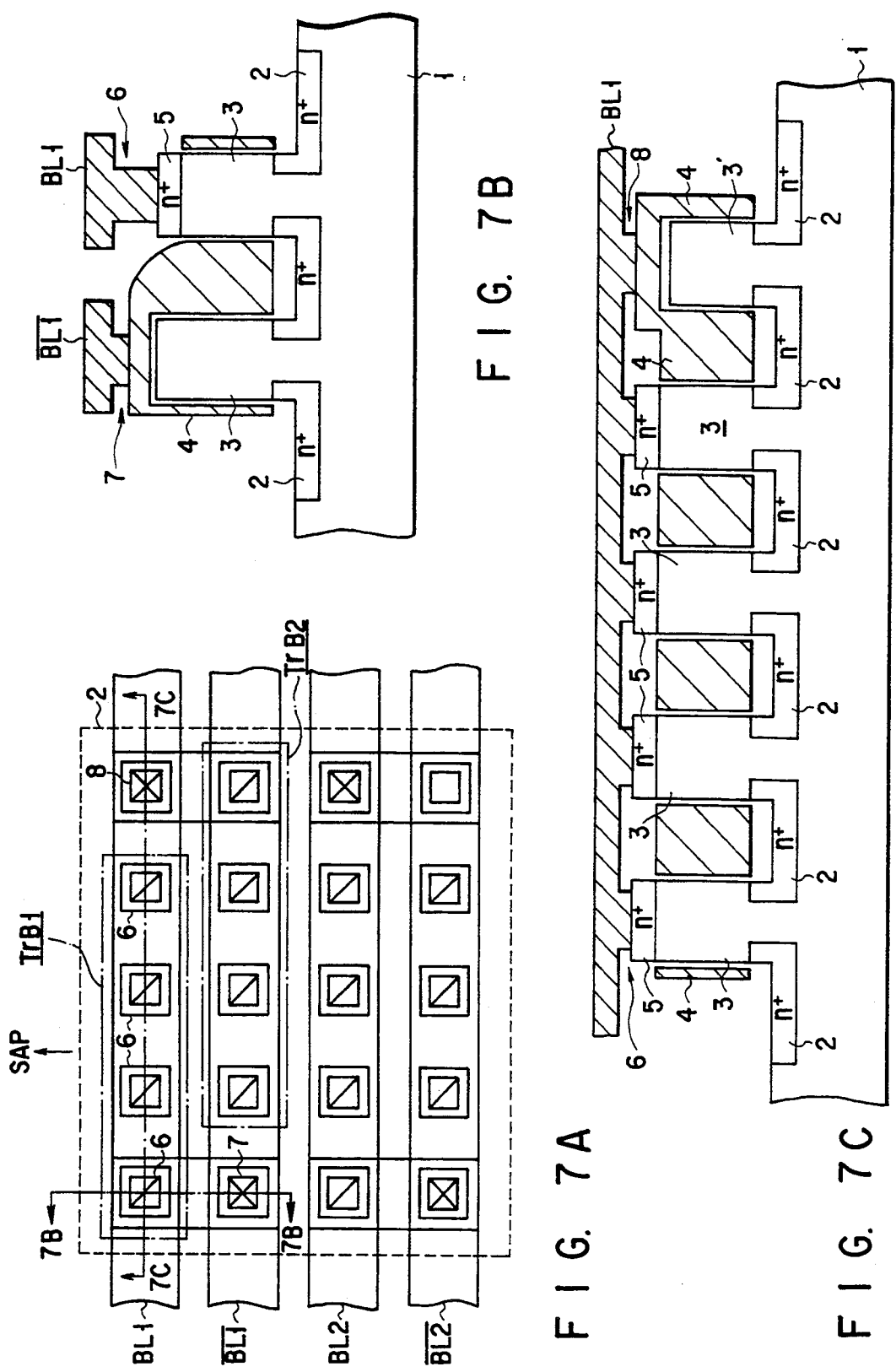

SEMICONDUCTOR DEVICE WITH VERTICAL TRANSISTORS CONNECTED IN SERIES BETWEEN BIT LINES

BACKGROUND OF THE INVENTION

1. Field of the Invention

The present invention relates to a semiconductor device using a MOS transistor.

2. Description of the Related Art

A dynamic RAM (DRY) is known as a semiconductor device. It is expected that a recently developed DRAM having a vertical MOS transistor and having a small surface area will increase integration density.

FIG. 1A shows an external appearance of the vertical memory cell applied to the DRAM, and FIG. 1B is a cross-sectional view taken along line 1B—1B in FIG. 1A. The vertical memory cell comprises one MOS capacitor and one MOS transistor. A columnar semiconductor layer 93 is formed continuously from a semiconductor substrate 91. The MOS capacitor is formed at a bottom portion of the semiconductor layer 93. Specifically, an n+ layer 98, which will function as a substrate-side electrode, and a plate electrode 94 are formed around the bottom portion of the semiconductor layer 93, with a capacitor insulating film (not shown) interposed between the n+ layer 98 and the plate electrode 94. Numeral 92 denotes an inversion preventing layer. On the other hand, the MOS transistor is formed at a top portion of the semiconductor layer 93. Specifically, a gate electrode 95 is formed around the top portion of the semiconductor layer 93, with a gate insulating film (not shown) being interposed. An n+ layer 96, which will function as a source or drain of the MOS transistor, is formed on the surface of the semiconductor layer 93, and a bit line 97 is connected to the n+ layer 96.

FIG. 2A is a plan view showing a part of an equalizer circuit of a DRAM using a vertical transistor, and FIG. 2B is a cross-sectional view taken along line 2B—2B in FIG. 2A. This vertical transistor corresponds to the MOS transistor formed at the top portion of the semiconductor layer 93 in FIGS. 1A and 1B, and common parts are denoted by like reference numerals. Symbols BL and /BL denote bit lines. Symbol EL denotes an equalizer wire through which an equalizer signal is supplied. The bit line /BL is connected to a diffusion layer 98, which will function as a source or drain of the semiconductor substrate 91, via a contact layer 99. Since the contact layer 99 is formed on the diffusion layer 98 so that the bit line/BL may become on a level with the bit line BL, the bit lines BL and /BL can be formed easily.

The above MOS transistor, however, has the following problem. When the contact layer 99 is formed on the source/drain diffusion layer 98, an alignment error may occur between the contact layer 99 and the source/drain diffusion layer 98. At this time, if a contact area between the contact layer 99 and diffusion layer 98 decreases, a desired contact resistance will not be obtained. Even if a small alignment error occurs, at least a predetermined contact area needs to be maintained, and for this purpose it is conventionally required to form the contact layer 99 with a diameter of 1.5 F or more (F=minimum processing dimension). Besides, in order to prevent undesirable connection between the contact layer 99 and equalizer wire EL, it is conventionally required to form the contact layer 99 at a distance F or more from the semiconductor layer 93.

Because of various limitations mentioned above, even if the vertical transistor is adopted in the DRAM equalizer circuit, remarkable reduction in area is not expected. Of course, this problem occurs in peripheral circuits, other than the equalizer circuit, which require transistors. Moreover, even the vertical transistor cannot be used in a sense amplifier which should desirably be formed between the bit lines BL and/BL which are arrange at an interval F for increasing integration density.

Furthermore, the DRAM adopting the vertical memory cell has the following problem. FIG. 3 is a cross-sectional view showing two adjacent vertical memory cells within a cell array. Since the vertical memory cell has a structure in which the gate electrode 95 is formed around the columnar semiconductor layer 93, the gate electrodes 95 of the adjacent vertical memory cells are opposed to each other. Consequently, a parasitic capacitance is produced between the gate electrodes 95 of the adjacent vertical memory cells, and a leak current flows. In addition, the word line 95 has a shunt structure for reducing resistance. Specifically, the gate wires are put in contact with shunt wires A at predetermined intervals. A coupling ratio $C_{WL-WL}$ between the word lines 95 is expressed by equation (1), when the capacitance of the entire word wires is CWL, the capacitance between the gate wires is $C_1$, and the capacitance between the shunt wires is $C_2$:

$$C_{WL-WL}=(C_1+C_2)/C_{WL} \qquad (1)$$

The capacitance $C_{WL}$ of the entire word lines is substantially equal to the capacitance $C_2$ between the shunt wires, whether the memory cell structure is an SGT structure or a conventional structure. However, the capacitance $C_1$ between the gate wires varies greatly, depending on the memory cell structure. In the case of the conventional memory cell, the MOS transistor has a flat structure and therefore the capacitance $C_1$ between the gate wires is low.

Besides, the parasitic capacitance $C_1$ between the gate wires is not negligible, since the gate electrodes of the adjacent vertical memory cells are opposed to each other. Thus, the potential level of the nonselected word line located adjacent to the selected word line increases. As described above, the reliability of the DRAM using the vertical memory cell is lower than the DRAM using the conventional flat memory cell.

SUMMARY OF THE INVENTION

The object of the present invention is to provide a semiconductor device using a vertical transistor for facilitating wiring contact and increasing integration density.

In order to achieve this object, there is provided a semiconductor device connected between a first wiring line and a second wiring line, the device comprising: a semiconductor substrate; a first semiconductor column formed on the semiconductor substrate; a second semiconductor column formed on the semiconductor substrate, with a predetermined distance set from the first semiconductor column; a first gate electrode formed around a side wall of the first semiconductor column with an insulating layer interposed; a second gate electrode formed around a side wall of the second semiconductor column with an insulating layer interposed; a first diffusion layer functioning as one of a source and a drain, the first diffusion layer being formed at a top portion of the first semiconductor column and connected to the first wiring line; a second diffusion layer functioning as another of the source and the drain, the second diffusion layer being formed at a top portion of the second semiconductor column and connected to the second wiring line; and a diffusion layer functioning as one of a source and a drain, the diffusion layer being formed at bottom portions and peripheral portions of the bottom portions of the first and second semiconductor columns and shared by the first and second semiconductor columns.

In the semiconductor device of the present invention, a semiconductor column formed along with processing of a semiconductor column of a transistor is used as a contact layer. Accordingly, there is no possibility of an alignment error, which may occur if the contact layer is formed in a manufacturing step different from the step of forming the semiconductor column of the transistor. Therefore, integration density can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A shows a circuit indicated by a broken line 6A in FIG. 4;

FIG. 6B is a plan view of FIG. 6A;

FIG. 7A is a plan view of a flip-flop circuit in a sense amplifier shown in FIG. 4;

FIG. 7B is a cross-sectional view taken along line 7B—7B in FIG. 7A;

FIG. 7C is a cross-sectional view taken along line 7C—7C in FIG. 7A;

DETAILED DESCRIPTION OF THE PREFERRED EMBODIMENTS

An embodiment of the present invention will now be described with reference to the accompanying drawings.

<First Embodiment>

Figure 4:
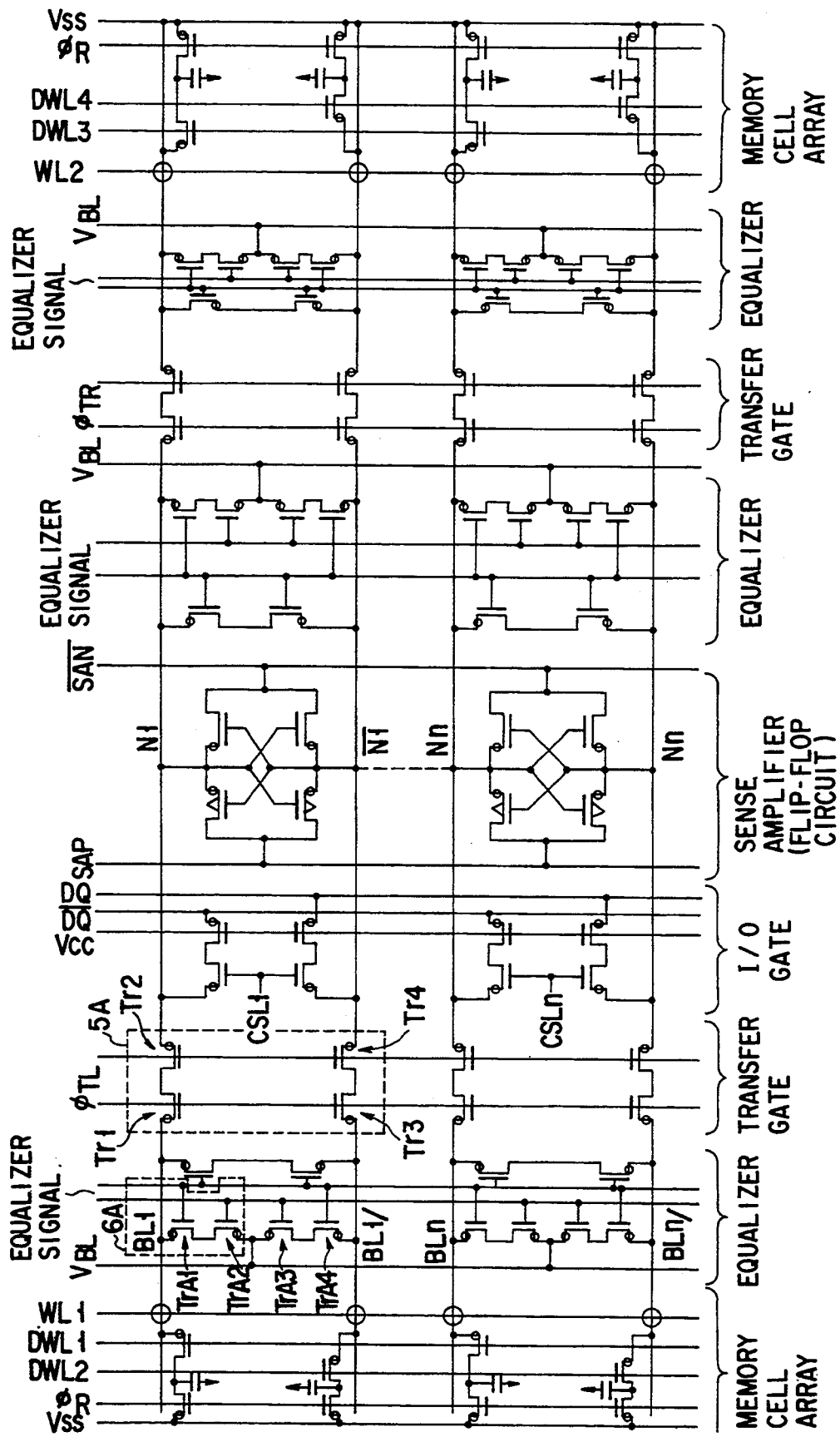
FIG. 4 is a circuit diagram of a DRAM according to a first embodiment of the present invention.

FIG. 4 is a circuit diagram showing a DRAM according to a first embodiment of the present invention. In FIG. 4, source diffusion layers (or drain diffusion layers) of MOS transistors are indicated by sign, "o". An $n \times m$ number of memory cells, excluding dummy cells, are arranged. Because of lack of space, FIG. 4 shows only two word lines and a circuit associated with the two word lines. The circuit of FIG. 4 is repeatedly formed to produce the entire actual circuit.

Figure 1A:
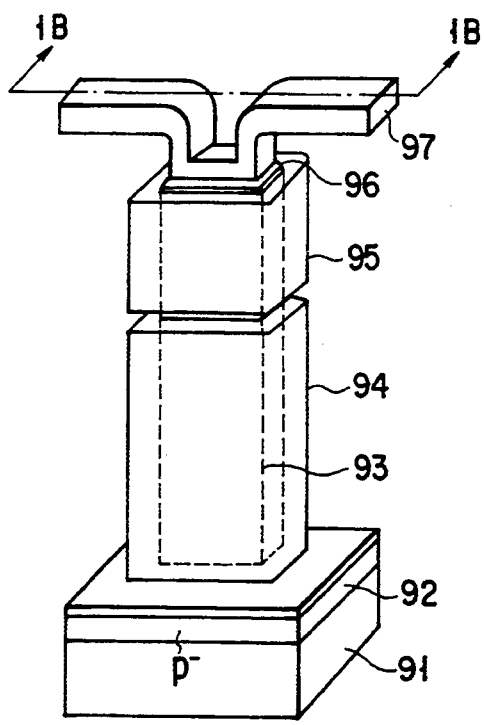
FIG. 1A shows an external appearance of a vertical memory cell.
Figure 1B:
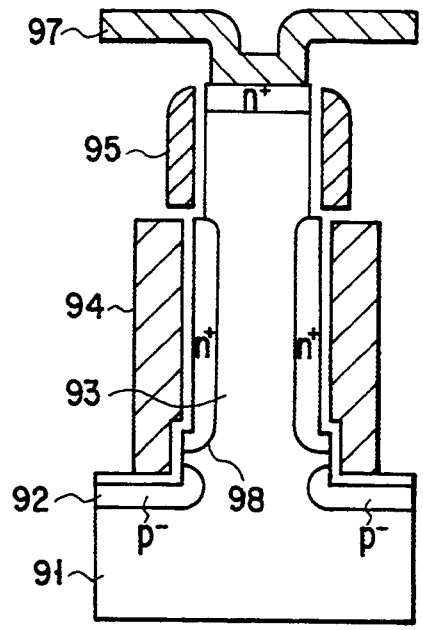
FIG. 1B is a cross-sectional view taken along line 1B—1B in FIG. 1A.
Figure 2A:
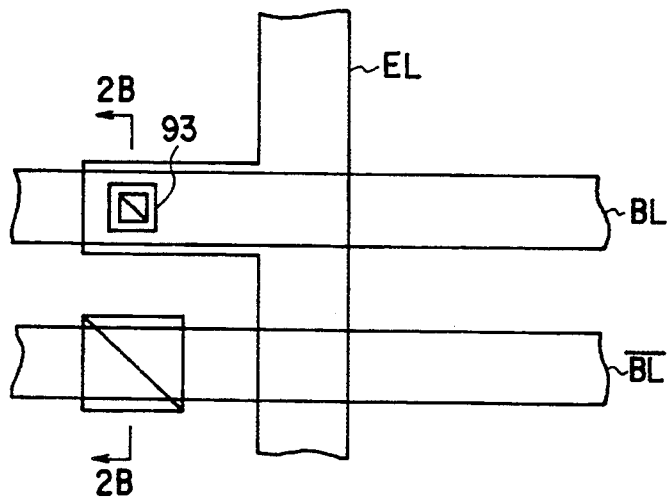
FIG. 2A is a plan view of a sense amplifier.
Figure 2B:
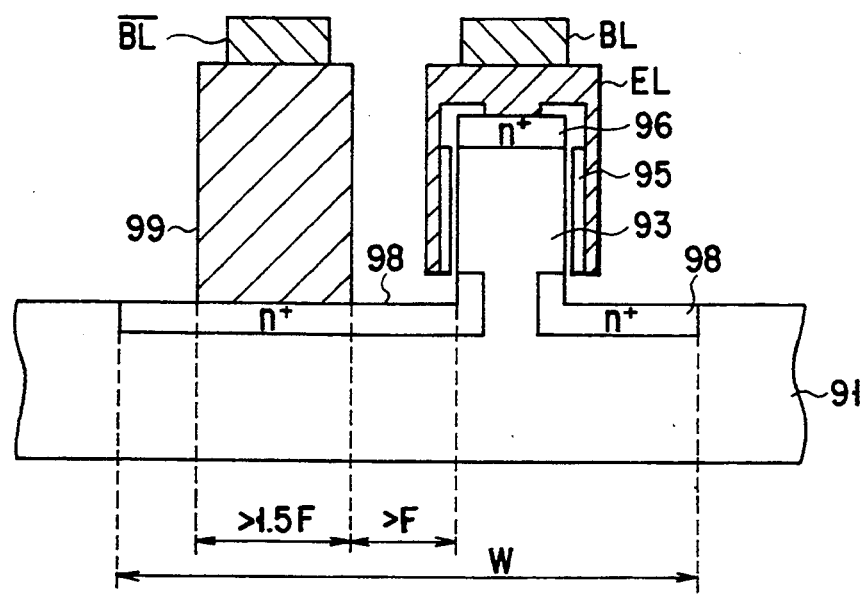
FIG. 2B is cross-sectional view taken along line 2B—2B in FIG. 2A.
Figure 3:
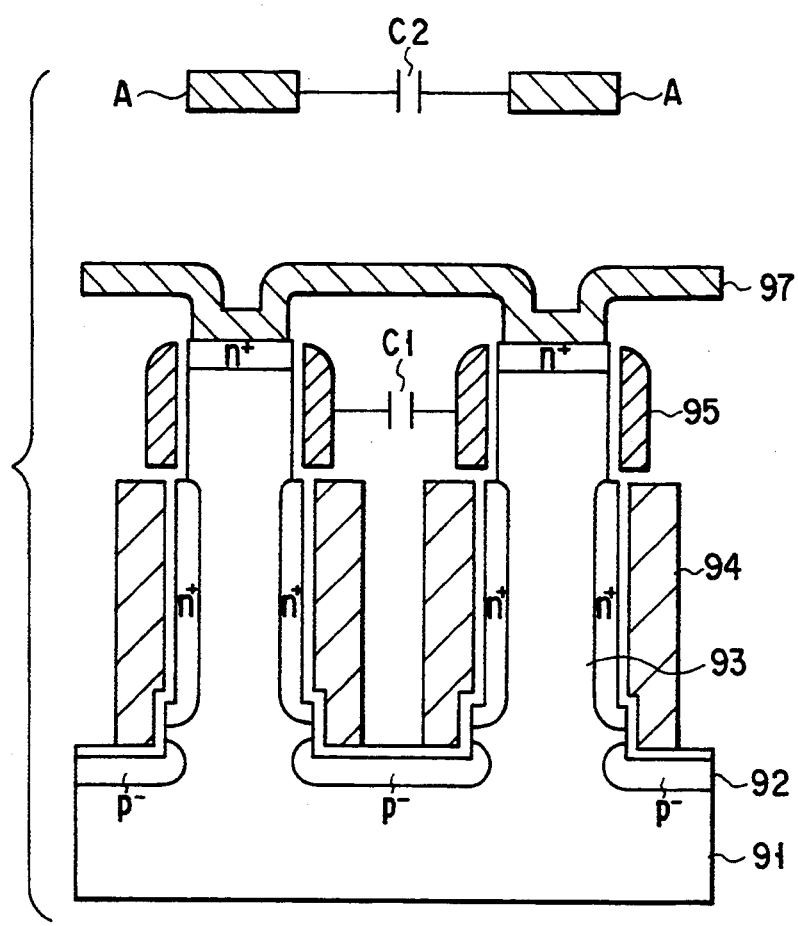
FIG. 3 is cross-sectional view of adjacent two vertical memory cells.

In the prior art, as shown in FIG. 2B, the diffusion layer, which will function as a source or drain of the vertical MOS transistor, is formed at the bottom of the transistor. Thus, the columnar contact layer is formed on the diffusion layer, and the top portion of the contact layer is connected to wiring. In order to permit an alignment error occurring when the contact layer is connected to the diffusion layer functioning as source or drain, it is necessary to make the diameter of the contact layer greater than a minimum processing dimension F, resulting in a greater area occupied by the vertical MOS transistor. In the first embodiment, in order to solve this problem, a dummy semiconductor column is formed at an adjacent position to a semiconductor column of a vertical MOS transistor on a semiconductor substrate. The dummy semiconductor column shares the diffusion layer functioning as source or drain, which is formed at the bottom and periphery of the bottom of the vertical MOS transistor. A top portion of the dummy semiconductor column is put in contact with wiring. This technique characterizes the first embodiment. The vertical MOS transistor having such a dummy semiconductor column is applicable to all vertical MOS transistors in the peripheral circuits of the DRAM.

Figure 5A:
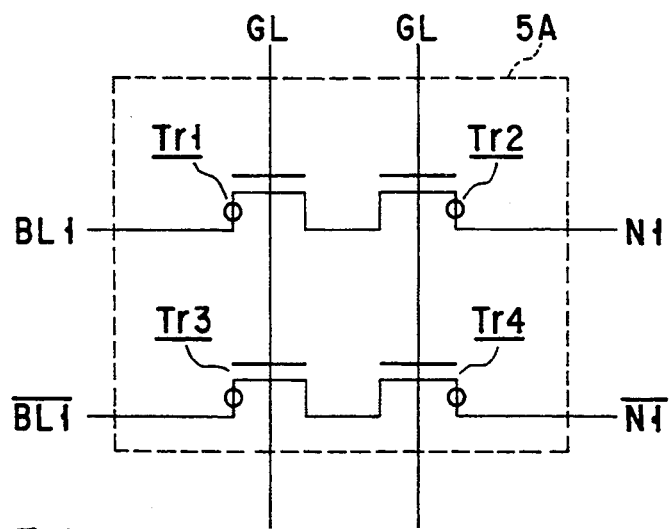
FIG. 5A shows a circuit indicated by a broken line 5A in FIG. 4.
Figure 5B:
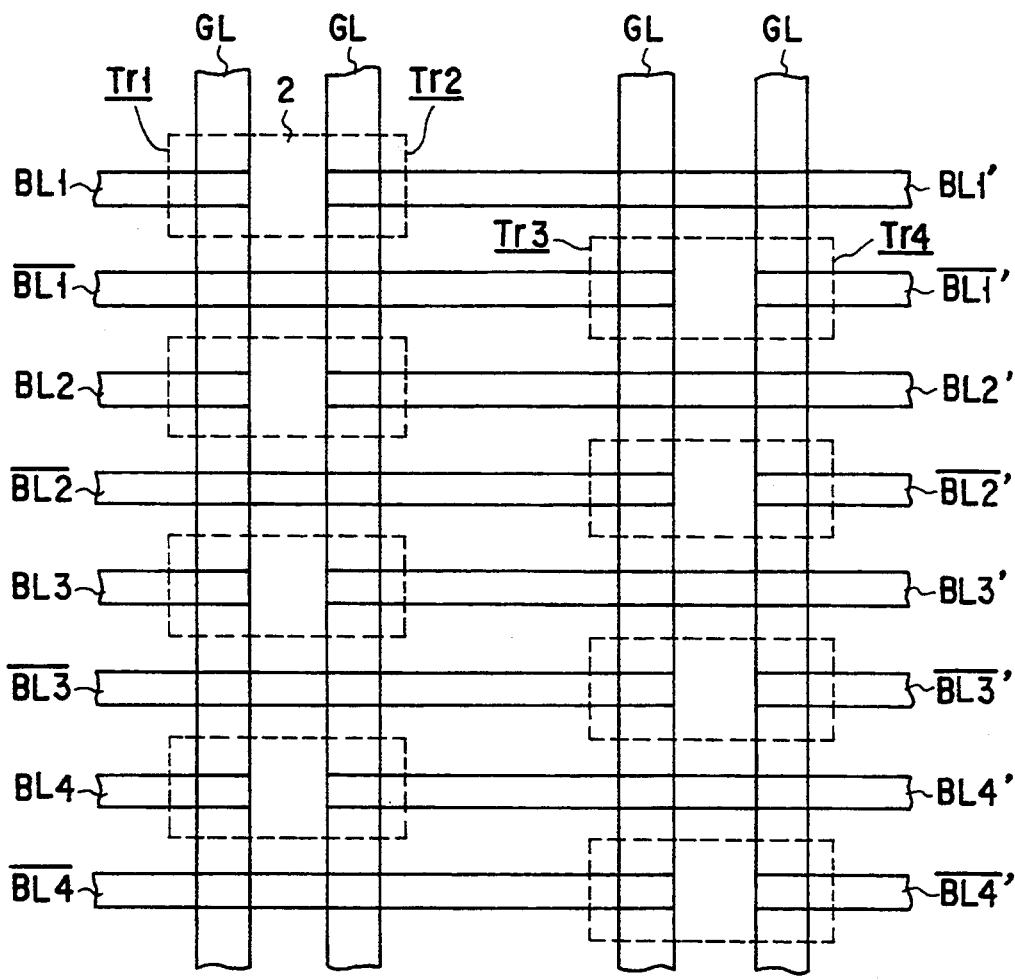
FIG. 5B is a plan view of the circuit shown in FIG. 5A.
Figure 5C:
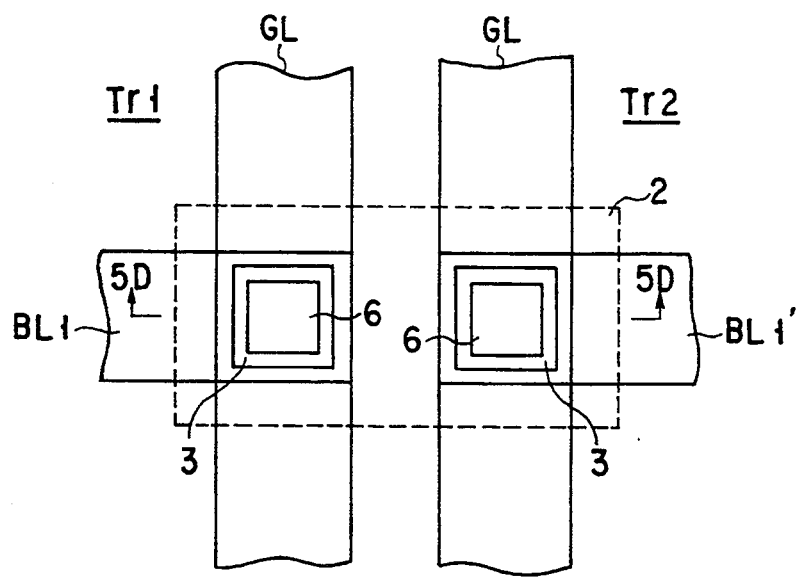
FIG. 5C is a partly enlarged view of FIG. 5B.
Figure 5D:
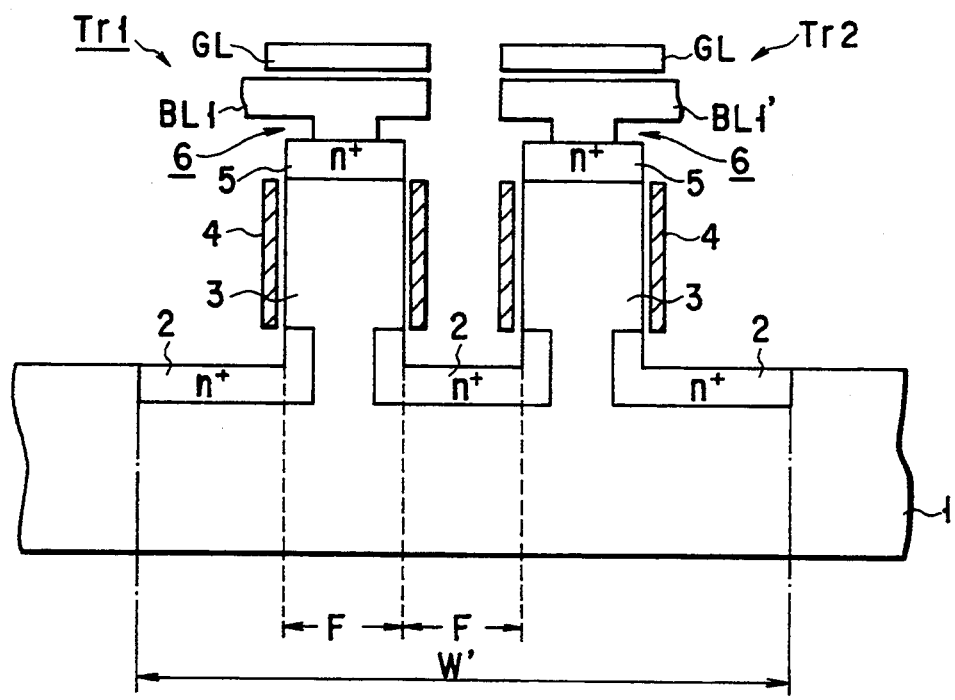
FIG. 5D is a cross-sectional view taken along line 5D—5D in FIG. 5C.

FIG. 5A is a circuit diagram of one transfer gate encircled by a broken line 5A in FIG. 4. FIG. 5B is a plan view of the circuit of FIG. 5A. FIG. 5C is an enlarged view of a part of the circuit shown in FIG. 5B, and FIG. 5D is a cross-sectional view taken along line 5D—5D in FIG. 5C. The transfer gate is a switching element inserted in part of bit lines connecting memory cells and a sense amplifier, for controlling connection between the bit lines on the memory cell side and the bit lines on the sense amplifier side.

Vertical MOS transistors Tr1 and Tr2 are connected in series, sharing a diffusion layer 2 which will function as a source. One of the vertical MOS transistors (e.g. Tr1) is a dummy transistor. For the purpose of simplicity of manufacturing steps, the dummy vertical MOS transistor Tr1 and the non-dummy vertical MOS transistor Tr2 are formed in the same steps to have the same structure. So-called "SGT (Surrounding Gate Transistor)" is used as each of the vertical MOS transistors Tr1 and Tr2. As is shown in FIG. 5D, two semiconductor columns 3 each having a diameter of minimum processing dimension F are formed adjacent to each other on a semiconductor substrate 1 (e.g. silicon) with a distance of minimum processing dimension F. A semiconductor column 3 of the transistor Tr1 functions as a dummy for contact with wiring (bit line BL1). The semiconductor substrate 1 with sufficiently great thickness is etched at a predetermined depth to form lattice-shaped grooves, and the two remaining projections function as two semiconductor columns 3. A diffusion layer 2 functioning as source or drain (functioning as source in this embodiment) is formed in a surface portion of the semiconductor substrate 1 at the bottom and periphery of the bottom of each of the two semiconductor columns 3. The source diffusion layer 2 formed between the two semiconductor columns 3 is shared by the two vertical MOS transistors (Tr1, Tr2). A gate electrode 4 is formed around a side wall of each semiconductor column 3 with a gate insulating film (not shown) interposed therebetween. A diffusion layer 5 functioning as source is formed at a top portion of the semiconductor column 3 of the vertical MOS transistor Tr1, and a diffusion layer 5 functioning as source or drain (functioning as drain in this embodiment) is formed at a top portion of the semiconductor column 3 of the vertical MOS transistor Tr2. The source diffusion layer 5 at the top of the transistor Tr1 is connected to the memory cell-side bit line BL1 via a contact hole 6, and the drain diffusion layer 5 at the top of the semiconductor column 3 of the transistor Tr2 is connected to the sense amplifier-side bit line BL1' via a contact hole 6. Gate lines GL extend from a CPU (not shown) and are connected to both gate electrodes 4 of the transistors Tr1 and Tr2.

When the same control signal is applied to the gate electrodes 4 of the transistors Tr1 and Tr2 via the gate lines GL, the memory cell-side bit lines BL1 is connected to the sense amplifier-side bit line BL1'. Thereby, the memory cell is connected to the sense amplifier, and a capacitor charge of the memory cell is input to the sense amplifier. A line from a power supply may be connected to the gate electrode 4 of the dummy transistor Tr1 to maintain the dummy transistor Tr1 in the closed state.

As described above, a wiring layer (bit line layer) can be formed on each top portion of the two semiconductor columns formed based on the same design rules. Therefore, there is no need to form the contact layer in a manufacturing step separate from the manufacturing step for the vertical MOS transistor, and the manufacturing process can be simplified.

In addition, since the two semiconductor columns can be simultaneously formed with the same etching pattern, the diameter of each of the semiconductor column 3 and the distance therebetween can be set at the minimum processing dimension F. In the prior art, as shown in FIG. 2B, since the wiring layer of bit lines BL and BL' is formed on the first diffusion layers at the top of the vertical MOS transistors, the contact layer is formed in a separate step at the bottom of the vertical MOS transistor and on the second diffusion layer on the periphery of the bottom. Consequently, in order to permit an alignment error between the contact layer and the diffusion layer, it is necessary to set the diameter of the contact layer at $1.5 \times F$ or above. In the present embodiment, the diameter of the semiconductor column 3 of the transistor Tr1, which is substituted for the contact layer, can be set at the minimum processing dimension F, similarly with the transistor Tr2. Accordingly, in this embodiment, the entire length W' of the device can be made less than the entire length W of the conventional switching device by $0.5 \times F$ or more.

FIG. 6A is a circuit diagram showing one equalizer circuit indicated by a broken line 6A in FIG. 4. FIG. 6B is a plan view of the circuit shown in FIG. 6A. The equalizer circuit controls connection between a pair of bit lines BL and /BL connected to the same memory cell. The equalizer of this embodiment is constituted such that four vertical MOS transistors TrA1, TrA2, TrA3 and TrA4 are connected in series. An A—A' cross-sectional view of FIG. 6B is identical to FIG. 5D, except that bit line BL is changed to /BL. Specifically, two semiconductor columns each having a diameter of minimum processing dimension F are formed adjacent to each other on a semiconductor substrate (e.g. silicon) with a distance of minimum processing dimension F. The semiconductor substrate with sufficiently great thickness is etched at a predetermined depth to form lattice-shaped grooves, and the two remaining projections function as two semiconductor columns of the vertical MOS transistors TrA1 and TrA2. One of the vertical MOS transistors TrA1 and TrA2 (e.g. TrA1) is a dummy, like the transistor Tr1 of the above-described transfer gate, and a bit line BL is connected to a diffusion layer functioning as source or drain, which is formed at the top of this vertical MOS transistor. An equalizer signal is synchronously supplied to the gate electrodes of the vertical MOS transistors TrA1 and TrA2. When the equalizer signal is applied from the CPU (not shown) to both gate electrodes of the transistors TrA1 and TrA2 via gate lines GL, the bit lines BL1 and /BL are interconnected. A line from a power supply may be connected to the gate electrode of the dummy transistor TrA1 to constantly maintain the dummy transistor TrA1 in the closed state.

The structure and operation of the vertical MOS transistors TrA1 and TrA2 are identical to those of the vertical MOS transistors TrA3 and TrA4. One of the two series-connected vertical MOS transistors is used as a contact layer, thereby obtaining the same advantage as in the case of the transfer gate.

FIG. 7A is a plan view of a sense amplifier corresponding to the bit lines BL1 and /BL1, and FIG. 7B is a cross-sectional view taken along line 7B—7B in FIG. 7A. FIG. 7C is a cross-sectional view taken along line 7C—7C in FIG. 7A. As is shown in FIG. 4, the sense amplifier comprises a flip-flop circuit for amplifying a potential difference between the paired bit lines BL and /BL connected to the same memory cell. Numeral 7 denotes a contact portion between a source/drain diffusion layer at the top of the semiconductor column and the bit line, and numeral 8 denotes a contact portion between the bit line and the gate electrode.

As is shown in FIG. 7B, two semiconductor columns 3 each having a diameter of minimum processing dimension F are formed adjacent to each other on a semiconductor substrate 1 (e.g. silicon) with a distance of minimum processing dimension F. The semiconductor substrate 1 with sufficiently great thickness is etched at a predetermined depth to form lattice-shaped grooves, and the two remaining projections function as two semiconductor columns 3. A diffusion layer 2 functioning as source or drain (functioning as source in this embodiment) is formed in a surface portion of the semiconductor substrate 1 at the bottom and periphery of the bottom of each of the two semiconductor columns 3. The source diffusion layer 2 formed between the two semiconductor columns 3 is shared by the two semiconductor columns. A gate electrode 4 is formed around a side wall of each semiconductor column 3 with a gate insulating film (not shown) interposed therebetween. The gate electrode 4 is formed up to the top of the bit line 5 (/BL1)-side semiconductor column 3. The gate electrode 4 formed at the top of the bit line (/BL1)-side semiconductor column 3 is connected to the bit line /BL1 via a contact hole 7. A diffusion layer 5 functioning as source or drain (functioning as drain in this embodiment) is formed at a top portion of bit line (BL)-side semiconductor column 3. This drain diffusion layer 5 is connected to the bit line BL1 via a contact hole 6, and the drain diffusion layer 5 at the top of the semiconductor column 3 of the transistor Tr2 is connected to the sense amplifier-side bit line BL1' via a contact hole 6. Gate lines GL are connected to both gate electrodes 4 of the transistors Tr1 and Tr2.

As shown in FIG. 7C, five semiconductor columns 3 each having a diameter of minimum processing dimension F are formed linearly on a semiconductor substrate 1 (e.g. silicon) with a distance of minimum processing dimension F. The semiconductor substrate 1 with sufficiently great thickness is etched at a predetermined depth to form lattice-shaped grooves, and the five remaining projections function as five semiconductor columns 3 and 3'. A diffusion layer 2 functioning as source or drain (functioning as source in this embodiment) is formed in a surface portion of the semiconductor substrate 1 at the bottom and periphery of the bottom of each of the five semiconductor columns 3 and 3'. The source diffusion layer 2 formed between adjacent two of the five semiconductor columns 3 and 3' is shared by the adjacent two semiconductor columns 3. A gate electrode 4 is formed around a side wall of each semiconductor column 3, 3' with a gate insulating film (not shown) interposed therebetween. The gate electrode 4 is formed up to the top of the endmost semiconductor column 3'. This gate electrode 4 is connected to the bit line BL1 via a contact hole 8. A diffusion layer 5 functioning as source or drain (functioning as drain in this embodiment) is formed at a top portion of each of semiconductor columns 3 excluding the endmost column 3'. This drain diffusion layer 5 is connected to the bit line BL1 via a contact hole 6.

As described above, the semiconductor column formed in the same manufacturing steps as the semiconductor column of the vertical MOS transistor is used as a contact layer, and thereby the same effect as in the case of the transfer gate can be obtained.

Figures 8A, 8B:
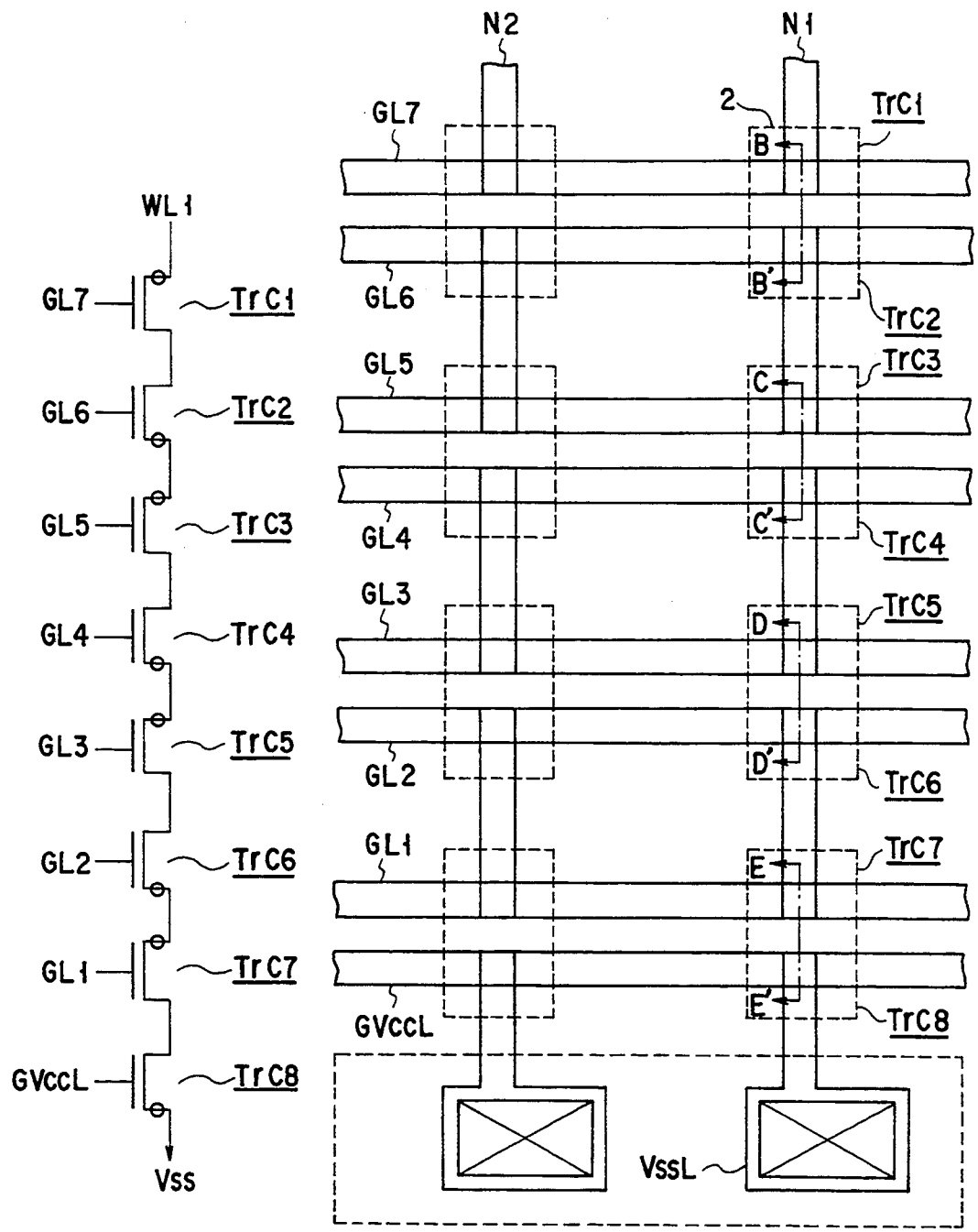
FIG. 8A is a circuit diagram of a NAND circuit in a row decoder.
FIG. 8B is a plan view of FIG. 8A.

FIG. 8A is a circuit diagram of a NAND circuit in a row decoder which is one of peripheral circuits of the DRAM, and FIG. 8B is a plan view of the circuit of FIG. 8A. The row decoder is provided with the same number of NAND circuits as the number of word lines, the NAND circuits being connected to different word lines. FIG. 8A shows only the NAND circuit connected to word line WL1, but the NAND circuits connected to the other word lines have the same structure. For the purpose of clear description, suppose that the number of word lines is seven.

The output of the NAND circuit is transferred to the word line WL via the next-stage amplifier circuit within the row decoder.

A memory cell array comprises a plurality of word lines, a plurality of bit lines crossing the word lines, and a plurality of memory cells arranged respectively at intersections of the word lines and bit lines. A row decoder selects a specified one of the word lines. One NAND circuit comprises, as indispensable elements, seven vertical MOS transistors TrC1 to TrC7, the number of which is equal to the number of word lines. These vertical MOS transistors TrC1 to TrC7 are connected in series. The word lines WL1 is connected to a diffusion layer functioning as a source or drain of the vertical MOS transistor TrC1. A dummy vertical MOS transistor TrC8 is connected in series to the vertical MOS transistor TrC7. A diffusion layer functioning as a source or drain of the dummy vertical MOS transistor TrC8 is connected to a power supply line extending from a power supply Vss.

A B—B' cross-sectional view, a C—C' cross-sectional view, a D—D cross-sectional view, and an E—E' cross-sectional view of FIG. 8B are similar to FIG. 5D. Each pair of adjacent vertical MOS transistors TrC1 and TrC2; TrC3 and TrC4; TrC5 and TrC6; and TrC7 and TrC8 are connected in series and share the diffusion layer, as shown in FIG. 5D. The transistor TrC8 is a dummy vertical MOS transistor. The dummy vertical MOS transistor TrC8 shares with the vertical MOS transistor TrC7 a diffusion layer formed at the bottom and periphery of the bottom (on substrate 1) of the dummy transistor TrC7 and functioning as a source or drain. The dummy transistor TrC7 is used merely as a contract layer with the power supply line from the power supply Vss. A control signal from a CPU (not shown) is supplied to the gate electrodes of the vertical MOS transistors TrC1 to TrC7, and the word line WL1 is selected. A power supply GVccL from a power supply is connected to the gate electrode of the dummy transistor TrC8, and the dummy transistor TrC8 is normally turned on in the closed state irrespective of the turning on/off of the transistor TrC7. The same control signal as is supplied to the gate electrode of the vertical MOS transistor TrC7 may also be supplied to the gate electrode of the dummy transistor TrC8, and the dummy TrC8 is opened/closed in synchronism with the transistor TrC7.

As described above, the dummy vertical MOS transistor TrC8 is connected in series to the vertical MOS transistor TrC7, and the external power supply line VssL is connected via the dummy vertical MOS transistor TrC8 to the diffusion layer which is formed at the bottom and periphery of the bottom of the vertical MOS transistor TrC7 and functions as a source or drain. Thereby, the power supply wiring can be connected to the top portion of the vertical MOS transistor TrC8 and accordingly it becomes not necessary to form the contact layer separately from the vertical MOS transistor TrC7. Therefore, the same advantage as in the case of the transfer gate can be obtained.

<Second Embodiment>

The second embodiment of the present invention aims at ensuring high reliability by avoiding an increase in level of a non-selected word line due to leak current caused by a parasitic capacitor occurring between gate electrodes of adjacent vertical transistors.

Figure 9A:
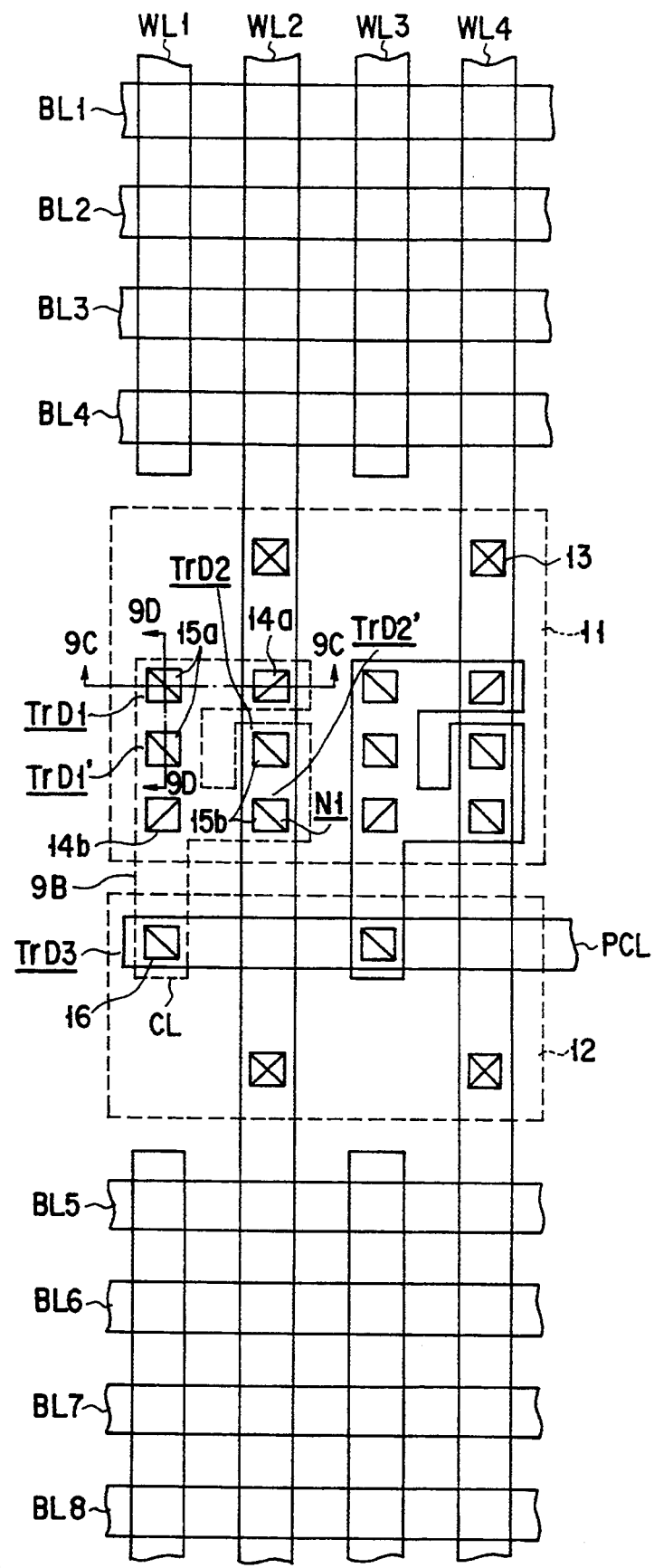
FIG. 9A is a plan view of a memory cell according to a second embodiment of the invention.
Figure 9B:
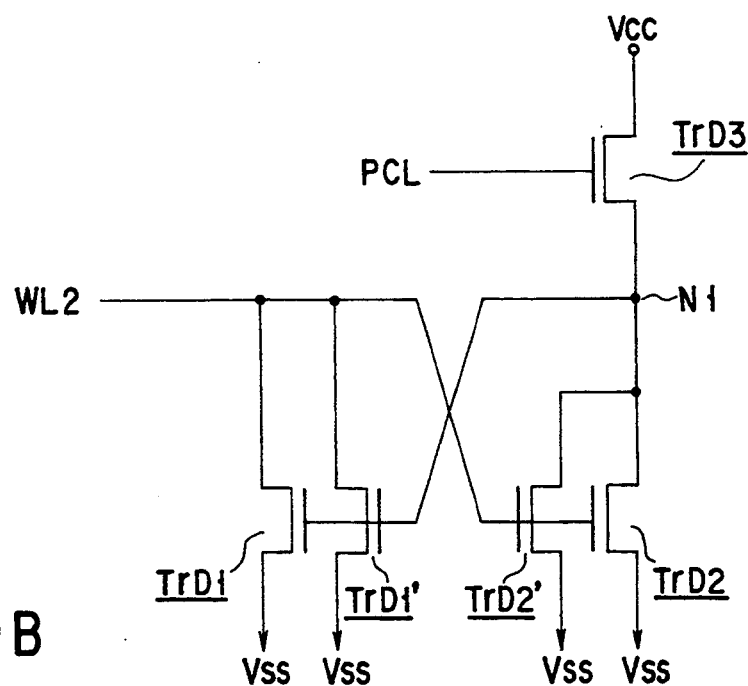
FIG. 9B shows a circuit (level stabilizing circuit) indicated by a line in FIG. 9A.
Figure 9C:
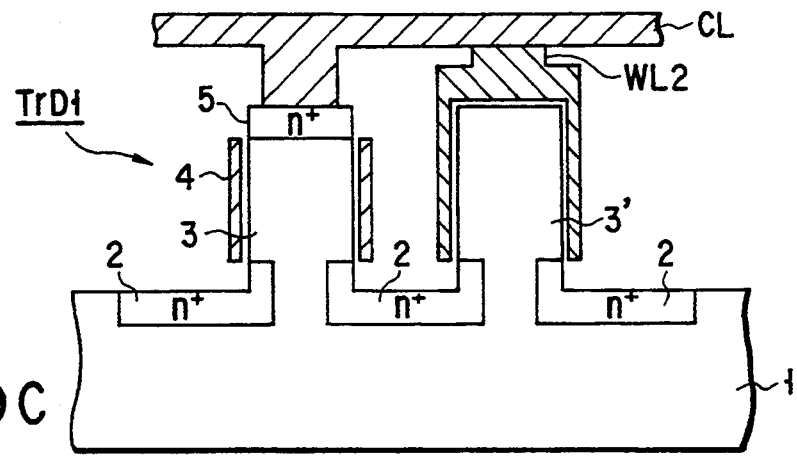
FIG. 9C is a cross-sectional view taken along line 9C—9C in FIG. 9A.
Figure 9D:
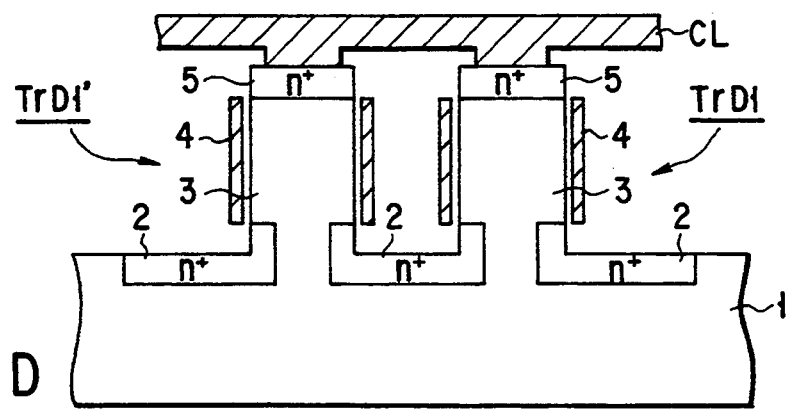
FIG. 9D is a cross-sectional view taken along line 9D—9D in FIG. 9A.

FIG. 9A is a plan view showing a part of a memory cell array according to the second embodiment of the invention. FIG. 9B is a circuit diagram of a level stabilizing circuit for a word line WL2 indicated by a broken line 9B in FIG. 9A. FIG. 9C is a cross-sectional view taken along line 9C—9C in FIG. 9A, and FIG. 9D is a cross-sectional view taken along line 9D—9D in FIG. 9A. The level stabilizing circuit is provided for each word line, for avoiding influence of leak current and stabilizing the word line potential at a predetermined value. As described in connection with the prior art, the potential of the non-selected word line adjacent to the selected word line varies due to the parasitic capacitor produced between the gate electrodes of the adjacent two vertical memory cells. The level stabilizing circuit functions to stabilize the non-selected word line potential at a predetermined value.

As is shown in FIG. 9C, a semiconductor column 3 having a diameter of minimum processing dimension F and a dummy semiconductor column 3' are formed on a semiconductor substrate 1 with a distance of minimum processing dimension F. The semiconductor substrate 1 with sufficiently great thickness is etched at a predetermined depth to form lattice-shaped grooves, and the remaining projections function as the semiconductor columns 3 and 3'. Drain diffusion layers 2 are formed in a surface portion of the semiconductor substrate 1 at the bottoms and peripheral portions of the bottoms of the two semiconductor columns 3 and 3'. A gate electrode 4 is formed around a side wall of the semiconductor column 3 with a gate insulating film (not shown) interposed therebetween. The gate electrode 4 is connected to a node N1 via a gate line (not shown). A drain diffusion layer 5 of the vertical MOS transistor Tr1 is formed at a top portion of the semiconductor column 3. The word line WL2 is formed on the top portion of the dummy semiconductor column 3' with an insulating layer (not shown) interposed, and the word line WL2 is connected to the drain diffusion layer 5 at the top of the vertical MOS transistor TrD1. The potential of the source diffusion layer 2 is set at low power supply potential Vss.

A gate electrode 4 is formed around a side wall of a semiconductor column 3 of a vertical MOS transistor TrD1' with a gate insulating film (not shown) interposed therebetween. The gate electrode 4 is connected to the node N1 via a gate line (not shown). A drain diffusion layer 5 of the vertical MOS transistor TrD1' is formed at a top portion of the semiconductor column 3. The word line WL2 is connected to the drain diffusion layer 5 at the top of the vertical MOS transistor TrD1.

The word line WL2 is connected to gate electrodes 4 of the vertical MOS transistors TrD2 and TrD2'. The vertical MOS transistors TrD2 and TrD2' are opened/closed in accordance with a variation in potential of the word line WL2 due to leak current. The drain diffusion layers of the vertical MOS transistors TrD2 and TrD2' are connected to the node N1, and the source diffusion layers thereof are set at low power supply potential Vss.

The source diffusion layer of the vertical MOS transistor TrD3 is connected to the node N1, and the drain diffusion layer thereof is set at high power supply potential Vcc.

The gate electrode of the vertical MOS transistor TrD3 is connected to a precharge line PL for supplying a precharge signal. The level stabilizing circuit is activated when it is supplied with the precharge signal. This activation is effected before the word line WL2 is selected.

Suppose that a word line WL3 adjacent to the word line WL2 is selected. When the word line WL3 is selected, leak current flows into the word line WL2 and the potential of the word line WL2 varies. If the potential of the word line WL2 varies, the operation state of the vertical MOS transistors TrD2 and TrD2' is changed from the open state to the closed state and the potential of the node N1 varies. If the potential of the node N1 varies, the operation state of the vertical MOS transistors TrD1 and TrD1' is changed from the open state to the closed state. Thereby, the potential of the word line WL2 is stabilized at a predetermined low level by the drain diffusion layer set at low power supply potential Vss.

According to the present embodiment, a potential fluctuation of the non-selected word line due to a parasitic capacitor between adjacent vertical memory cells is prevented, and degradation of reliability is prevented. In the present embodiment, since the word line WL2 is formed at the top of the dummy semiconductor column 3', the wiring step of the word line WL2 is simplified. In addition, since the dummy semiconductor column 3' is formed simultaneously with the semiconductor column 3 of the vertical MOS transistor TrD1 by etching the substrate 1 with sufficiently great thickness to form lattice-shaped grooves, the dummy semiconductor column 3' can be formed with minimum processing dimension F at a distance of minimum processing dimension F from the semiconductor column 3 of the vertical MOS transistor TrD1. Accordingly, the level stabilizing circuits can be formed between adjacent two word lines arranged at a distance of minimum processing dimension F with a width of minimum processing dimension F for higher integration density, and an increase in integration density is not prevented when MOS transistors of planar structure are used, one level stabilizing circuit requires a space for arranging at least four word lines, and it is not possible to form the level stabilizing circuit in a shunt area. In the present embodiment the level stabilizing circuit is provided in the shunt area, but it may be provided in other areas.

The present invention is not limited to the above embodiments. For example, in the above embodiments, two vertical MOS transistors constitute one transfer transistor, etc., but four or more vertical MOS transistors may constitute one transfer transistor, etc. if the number of vertical MOS transistors is an even number. Besides, the above-described two series-connected vertical MOS transistors are applicable to all switching devices for controlling connection between two conductors in a circuit other than the peripheral circuits. Furthermore, the level stabilizing circuit may have a general circuit structure, other than the above-described structure.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device connected between a first wiring line and a second wiring line, the device comprising:
   a semiconductor substrate;
   a first semiconductor column formed on said semiconductor substrate;
   a second semiconductor column formed on said semiconductor substrate, with a predetermined distance set from said first semiconductor column;
   a first gate electrode formed around a side wall of said first semiconductor column with an insulating layer interposed;

a second gate electrode formed around a side wall of said second semiconductor column with an insulating layer interposed;

a first diffusion layer functioning as one of a source and a drain, said first diffusion layer being formed at a top portion of said first semiconductor column and connected to said first wiring line;

a second diffusion layer functioning as another of the source and the drain, said second diffusion layer being formed at a top portion of said second semiconductor column and connected to said second wiring line; and a diffusion layer functioning as one of a source and a drain for said first semiconductor column and functioning as another of a source and a drain for said second semiconductor column, wherein said diffusion layer is formed at bottom portions and peripheral portions of said bottom portions of said first and second semiconductor columns is shared by said first and second semiconductor columns, and is not connected to any external wiring.

2. The device according to claim 1, wherein said device is used in a transfer gate of a semiconductor memory device, said semiconductor having an array of memory cells, a first bit line connected to a one of said memory cells, a second bit line connected to a dummy memory cell which is paired with said one of said memory cells, a sense amplifier for amplifying a potential difference between said first bit line and said second bit line, and said transfer gate for connecting said one of said memory cells and said dummy memory cell to said sense amplifier.

3. The semiconductor device according to claim 2, wherein said bit line from the sense amplifier side is put in contact with said first diffusion layer formed at the top portion of said first semiconductor column as said first wiring line, and said bit line from said one of memory cells side is put in contact with said second diffusion layer formed at the top portion of said second semiconductor column as said second wiring line.

4. The semiconductor device according to claim 1, further comprising:

a plurality of memory cells arranged in a matrix;

a first bit line connected to a one of said memory cells; and a second bit line connected to a dummy memory cell which is paired with said one of memory cells, wherein said first bit line is put in contact with said first diffusion layer formed at the top portion of said first semiconductor column as said first wiring line, and said second bit line is put in contact with said second diffusion layer formed at the top portion of said second semiconductor column as said second wiring line.

5. The semiconductor device according to claim 1, wherein said first gate electrode and said second gate electrode are activated synchronously.

6. The semiconductor device according to claim 1, wherein one of said first and second gate electrodes is normally turned on, when the another is turned on or off.

7. The semiconductor device according to claim 1, wherein said first and second semiconductor columns are projections left by etching said semiconductor substrate to produce lattice-shaped grooves.

8. The semiconductor device according to claim 1, wherein a distance between said first and second semiconductor columns is equal to a minimum processing dimension, and each of said first and second semiconductor columns has a diameter of the minimum processing dimension.

9. The semiconductor device according to claim 1, wherein said semiconductor device constitutes parts of an equalizer circuit, a transfer gate, an I/O gate and a sense amplifier circuit.

10. A semiconductor memory device comprising:

a plurality of word lines;

a plurality of bit lines crossing said word lines;

a plurality of memory cells provided at intersections of said word lines and said bit lines; and a row decoder for selecting a specified one of said word lines, the row decoder comprising a transistor, the transistor including a semiconductor substrate, a plurality of semiconductor columns formed on said semiconductor substrate with a predetermined distance in predetermined directions, an insulated gate electrode formed around a side wall of each of said semiconductor columns, a first diffusion layer functioning as one of a source and a drain, said first diffusion layer being formed at a top portion of one endmost one of said semiconductor columns and connected to said specified word line, a second diffusion layer functioning as one of a source and a drain, said second diffusion layer being formed at a top portion of the other endmost one of said semiconductor columns and connected to a power supply line, and a diffusion layer functioning as another of the source and the drain, wherein said diffusion layer is formed between adjacent ones of said semiconductor columns at bottom portions and peripheral portions of said bottom portions of said adjacent ones of semiconductor columns, is shared by said adjacent semiconductor columns and is not connected to any external wiring.

11. The semiconductor memory device according to claim 10, wherein said first and second semiconductor columns are projections left by etching said semiconductor substrate to produce lattice-shaped grooves.

12. The semiconductor memory device according to claim 10, wherein a distance between said adjacent semiconductor columns is equal to a minimum processing dimension, and each of said adjacent semiconductor columns has a diameter of the minimum processing dimensions.

13. The semiconductor memory device according to claim 10, wherein gate electrodes of said adjacent semiconductor columns are activated synchronously.

14. The semiconductor memory device according to claim 10, wherein one of the gate electrodes of said adjacent semiconductor columns is normally turned on, when the other is turned on or off.

15. A semiconductor memory device comprising:

a plurality of memory cells arranged in a matrix;

a first bit line connected to a one of said memory cells;

a second bit line connected to a dummy memory cell which is paired with said one of memory cells; and a sense amplifier, connected to said first bit line and said second bit line and having a transistor, for amplifying a potential difference between said first bit line and said second bit line, wherein said transistor includes, a semiconductor substrate, a first group of semiconductor columns formed linearly on said semiconductor substrate at predetermined intervals, a second group of semiconductor columns formed with a predetermined distance set from said first group of semiconductor columns, a first gate electrode formed to extend from a side wall of one of said first group of semiconductor columns, said one of said first group of semiconductor columns being adjacent to an endmost one of said first group of semiconductor columns, to a top portion of said endmost one of the first group of semiconductor columns with an insulating layer interposed, said first gate electrode being connected to said second bit line at said top portion of the endmost one of the first group of semiconductor columns, a second gate electrode formed to extend from a side wall of one of said second group of semiconductor columns, said one of said second group of semiconductor columns being adjacent to an endmost one of the second group of semiconductor columns, to a top portion of said endmost one of the second group of semiconductor columns with an insulating layer interposed, said second gate electrode being connected to said first bit line at said top portion of said endmost one of the second group of semiconductor columns, and a diffusion layer functioning as one of a source and a drain, said diffusion layer being shared by bottom portions of adjacent ones of said semiconductor columns of said first and second groups which are arranged linearly, wherein said diffusion layer is not connected to any external wiring.

16. The semiconductor memory device according to claim 15, wherein said first and second groups of semiconductor columns are projections left by etching said semiconductor substrate to produce lattice-shaped grooves.

17. The semiconductor memory device according to claim 15, wherein a distance between said semiconductor columns equals a minimum processing dimension, and each of said semiconductor columns has a diameter of the minimum processing dimension.

18. A semiconductor memory device comprising:
a plurality of memory cells arranged in a matrix;
a first bit line connected to a one of said memory cells;
a second bit line connected to another of said memory cells; and
an equalizer connected to said first bit line and said second bit line and having a transistor, for equalizing potentials of said first bit line and said second bit line,
wherein said transistor further includes,
a semiconductor substrate,
a first semiconductor column formed on said semiconductor substrate,
a second semiconductor column formed on said semiconductor substrate with a predetermined distance set from said first semiconductor column,
a first gate electrode formed around a side wall of said first semiconductor column with an insulating layer interposed,
a second gate electrode formed around a side wall of said second semiconductor column with an insulating layer interposed, said second gate electrode being electrically connected to said first gate electrode, a first diffusion layer being formed at a top portion of said first semiconductor column and connected to said first bit line, a second diffusion layer being formed at a top portion of said second semiconductor column and connected to said second bit line, and a diffusion layer functioning as one of a source and a drain, said diffusion layer being shared by bottom portions of said first and second semiconductor columns without being connected to any external wiring.

19. A semiconductor memory device comprising:
a plurality of memory cells arranged in a matrix;
a first bit line connected to a one of said memory cells;
a second bit line connected to another of said memory cells; and
a sense amplifier with two inputs, connected to said first bit line and said second bit line and having first and second transistors, for amplifying a potential difference between said first bit line and said second bit line, a first transistor connecting a first input of said two inputs to said first bit line, a second transistor connecting a second input of said two inputs to said second bit line,
wherein said first transistor includes,
a semiconductor substrate,
a first semiconductor column formed on said semiconductor substrate,
a second semiconductor column formed on said semiconductor substrate with a predetermined distance set from said first semiconductor column,
a first gate electrode formed around a side wall of said first semiconductor column with an insulating layer interposed,
a second gate electrode formed around a side wall of said second semiconductor column with an insulating layer interposed, said second gate electrode being electrically connected to said first gate electrode,
a first diffusion layer being formed at a top portion of said first semiconductor column and connected to said first bit line,
a second diffusion layer being formed at a top portion of said second semiconductor column and connected to said first input, and
a fifth diffusion layer functioning as one of a source and a drain, said fifth diffusion layer being shared by bottom portions of said first and second semiconductor columns without being connected to any external wiring, and
wherein said second transistor includes,
a semiconductor substrate,
a third semiconductor column formed on said semiconductor substrate,
a fourth semiconductor column formed on said semiconductor substrate with a predetermined distance set from said third semiconductor column,
a third gate electrode formed around a side wall of said third semiconductor column with an insulating layer interposed,
a fourth gate electrode formed around a side wall of said fourth semiconductor column with an insulating layer interposed, said fourth gate electrode being electrically connected to said third gate electrode, a third diffusion layer being formed at a top portion of said third semiconductor column and connected to said second bit line, a fourth diffusion layer being formed at a top portion of said fourth semiconductor column and connected to said second input, and a sixth diffusion layer functioning as one of a source and a drain, said sixth diffusion layer being shared by bottom portions of first and second semiconductor columns without being connected to any external wiring.

20. A semiconductor memory device comprising:

a plurality of memory cells arranged in a matrix;

a first bit line connected to a one of said memory cells;

a second bit line connected to another of said memory cells; and an equalizer connected to said first bit line and said second bit line and having a transistor, for equalizing potentials of said first bit line and said second bit line, wherein said transistor includes, a semiconductor substrate, a first semiconductor column formed on said semiconductor substrate, a second semiconductor column formed on said semiconductor substrate with a predetermined distance set from said first semiconductor column, a third semiconductor column formed on said semiconductor substrate, a fourth semiconductor column formed on said semiconductor substrate with a predetermined distance set from said third semiconductor column, a first gate electrode formed around a side wall of said first semiconductor column with an insulating layer interposed, a second gate electrode formed around a side wall of said second semiconductor column with an insulating layer interposed, said second gate electrode being electrically connected to said first gate electrode, a first diffusion layer being formed at a top portion of said first semiconductor column and connected to said first bit line, a second diffusion layer being formed at a top portion of said second semiconductor column and connected to a wiring with equalized potential of said first and second bit lines, a fifth diffusion layer functioning as one of a source and a drain, said fifth diffusion layer being shared by bottom portions of said first and second semiconductor columns without being connected to any external wiring, a third gate electrode formed around a side wall of said third semiconductor column with an insulating layer interposed, a fourth gate electrode formed around a side wall of said fourth gate electrode being electrically connected to said third gate electrode, a third diffusion layer being formed at a top portion of said third semiconductor column and connected to said second bit line, a fourth diffusion layer being formed at a top portion of said fourth semiconductor column and connected to a wiring with equalized potential of said first and second bit lines, and a sixth diffusion layer functioning as one of a source and a drain, said sixth diffusion layer being shared by bottom portions of said third and fourth semiconductor columns without being connected to any external wiring.

21. A semiconductor device connecting between a first wiring line and a second wiring line, the device comprising:

a semiconductor substrate;

a first semiconductor column structured with a feature size formed on said semiconductor substrate;

a second semiconductor column structured with the feature size, formed on said semiconductor substrate a distance of the feature size away from said first semiconductor column;

a first gate electrode formed around a side wall of said first semiconductor column with an insulating layer interposed;

a second gate electrode formed around a side wall of said second semiconductor column with an insulating layer interposed;

a first diffusion layer functioning as one of a source and drain, said first diffusion layer being formed at a top portion of said first semiconductor column and connected to said first wiring line;

a second diffusion layer functioning as another of the source and the drain, said second diffusion layer being formed at a top portion of said second semiconductor column and connected to said second wiring line; and a third diffusion layer functioning as one of a source and a drain for said first semiconductor column and functioning as another of a source and drain for said second semiconductor column, said third diffusion layer being formed at bottom portions and peripheral portions of said bottom portions of said first and second semiconductor columns shared by said first and second semiconductor columns.

* * * * *